(12) United States Patent
Tanigaki et al.

(10) Patent No.: US 10,224,165 B2
(45) Date of Patent: Mar. 5, 2019

(54) CIRCUIT BREAKER CHARACTERISTIC MONITORING DEVICE

(71) Applicant: Mitsubishi Electric Corporation, Chiyoda-ku Tokyo (JP)

(72) Inventors: Shuichi Tanigaki, Tokyo (JP); Tomohito Mori, Tokyo (JP); Aya Yamamoto, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 186 days.

(21) Appl. No.: 15/507,634

(22) PCT Filed: Sep. 2, 2014

(86) PCT No.: PCT/JP2014/073004
§ 371 (c)(1),
(2) Date: Feb. 28, 2017

(87) PCT Pub. No.: WO2016/035131
PCT Pub. Date: Mar. 10, 2016

(65) Prior Publication Data
US 2017/0287666 A1 Oct. 5, 2017

(51) Int. Cl.
*H01H 71/04* (2006.01)
*H01H 71/24* (2006.01)
(Continued)

(52) U.S. Cl.
CPC ......... *H01H 71/04* (2013.01); *G01R 31/2882* (2013.01); *G01R 31/3277* (2013.01);
(Continued)

(58) Field of Classification Search
CPC .... H01H 71/04; H01H 1/0015; H01H 71/123; H01H 83/04; H01H 83/20; H02H 3/335
(Continued)

(56) References Cited

U.S. PATENT DOCUMENTS

2007/0222427 A1   9/2007  Takeuchi et al.
2009/0027823 A1*  1/2009  Follic ................... H01F 7/1833
                                             361/153

FOREIGN PATENT DOCUMENTS

JP    54-145967 A    11/1979
JP    58-178929 A    10/1983
(Continued)

OTHER PUBLICATIONS

International Search Report (PCT/ISA/210) dated Nov. 25, 2014, by the Japanese Patent Office as the International Searching Authority for International Application No. PCT/JP2014/073004.
(Continued)

*Primary Examiner* — Dharti H Patel
(74) *Attorney, Agent, or Firm* — Buchanan Ingersoll & Rooney PC

(57) ABSTRACT

A circuit breaker characteristic monitoring device monitors the operation of a circuit breaker to estimate the amount of consumption of a movable contact and fixed contacts included in the circuit breaker. The device includes an operating time measurement unit to measure at least one of closing time, which is the time required for the circuit breaker to be closed after starting a closing operation, and opening time, which is the time required for the circuit breaker to be open after starting an opening operation, and a contact consumption amount estimation unit to estimate the amount of consumption of the movable contact and the fixed contacts on the basis of the result of measurement performed by the operating time measurement unit and travel speed of the movable contact during the closing operation or the opening operation for which the measurement result is obtained.

3 Claims, 2 Drawing Sheets

(51) Int. Cl.
  *H01H 1/00* (2006.01)
  *G01R 31/28* (2006.01)
  *G01R 31/327* (2006.01)
(52) U.S. Cl.
  CPC .......... *H01H 1/0015* (2013.01); *H01H 71/24* (2013.01); *H01H 2071/044* (2013.01); *H01H 2300/052* (2013.01)
(58) Field of Classification Search
  USPC ........................................................ 361/115
  See application file for complete search history.

(56) References Cited

FOREIGN PATENT DOCUMENTS

| | | |
|---|---|---|
| JP | S61-203517 A | 9/1986 |
| JP | S62-226519 A | 10/1987 |
| JP | 63-249068 A | 10/1988 |
| JP | 1-50332 A | 2/1989 |
| JP | 1-171369 U1 | 12/1989 |
| JP | 6-331675 A | 12/1994 |
| WO | WO 2005/111641 A1 | 11/2005 |

OTHER PUBLICATIONS

Written Opinion (PCT/ISA/237) dated Nov. 25, 2014, by the Japanese Patent Office as the International Searching Authority for International Application No. PCT/JP2014/073004.

Office Action (Notice of Rejection) dated Aug. 4, 2015 issued in the corresponding Japanese Patent Application No. 2015-517300 (English Translation only).

* cited by examiner

CIRCUIT BREAKER CHARACTERISTIC MONITORING DEVICE

FIELD

The present invention relates to a circuit breaker characteristic monitoring device that monitors the characteristics of a circuit breaker installed in a substation, a switching station, and the like.

BACKGROUND

Conventional devices for monitoring the characteristics of circuit breakers monitor opening time, which is the time between the output of a command during the operation of the circuit breakers and opening of circuit breaker contacts; closing time, which is the time between the output of a command and closing of the circuit breaker contacts; opening speed, which is the speed during the time between the start of movement of the circuit breaker contacts and opening; and closing speed, which is the speed during the time between the start of movement of the circuit breaker contacts and closing. For example, in the invention described in Patent Literature 1, opening time is finely divided, and the change during each time period after the division is monitored to detect any abnormality in the circuit breaker. Patent Literature 2 discloses an invention in which the rising point and the minimum point of a control current waveform at power-on, and an operation starting point, a predetermined-angle rotating point, and a total-angle rotating point of a rotational operating shaft are detected, and the time and the distance between the points are compared with reference values, thereby obtaining an indication of any abnormality in the circuit breaker.

CITATION LIST

Patent Literature

Patent Literature 1: Japanese Patent Application Laid-Open No. S61-203517
Patent Literature 2: Japanese Patent Application Laid-Open No. S62-226519

SUMMARY

Technical Problem

The above-described conventional arts can detect abnormalities in circuit breakers and obtain indications of abnormalities, but they have a problem in that they cannot detect the degree of consumption of consumables. Specifically, contacts in circuit breakers are consumed at contact portions due to wear and melting with each repetition of an opening operation and a closing operation. Thus, when the amount of consumption reaches a certain value, replacement is necessary. However, the conventional arts cannot detect the degree of consumption of consumables. Up to now, for example, it has been required to determine whether replacement is necessary by visual checks or the like during periodic inspections or inspection operations when abnormalities are detected, which poses a problem in that it is difficult to determine the appropriate timing for replacing consumables.

The present invention has been made in view of the above, and has an object of providing a circuit breaker characteristic monitoring device capable of determining the timing at which consumables of a circuit breaker need to be replaced.

Solution to Problem

In order to solve the above problems and achieve the object, an aspect of the present invention is a circuit breaker characteristic monitoring device that monitors an operation of a circuit breaker to estimate an amount of consumption of a movable contact and a fixed contact included in the circuit breaker. The circuit breaker characteristic monitoring device includes: an operating time measurement unit to measure at least one of closing time and opening time, the closing time being a time required for the circuit breaker to be closed after starting a closing operation, the opening time being a time required for the circuit breaker to be open after starting an opening operation; and a contact consumption amount estimation unit to estimate an amount of consumption of the movable contact and the fixed contact on a basis of a result of measurement performed by the operating time measurement unit and a travel speed of the movable contact during the closing operation or the opening operation for which the measurement result is obtained.

Advantageous Effects of Invention

This invention achieves an effect of being able to estimate the amount of consumption of consumables constituting a circuit breaker, thus allowing for the replacement of consumables at an appropriate timing.

DESCRIPTION OF EMBODIMENT

Hereinafter, an embodiment of a circuit breaker characteristic monitoring device according to the present invention will be described in detail with reference to the drawings. The embodiment is not intended to limit the invention.

Embodiment

Figure 1:
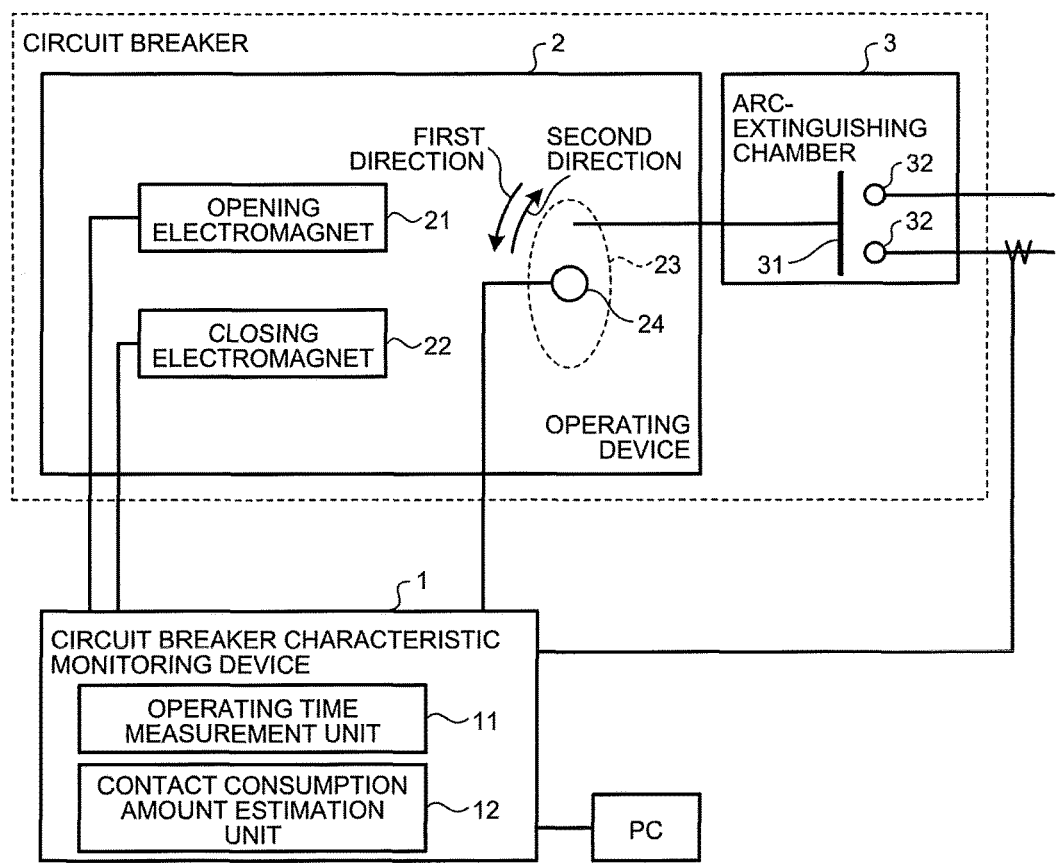
FIG. 1 is a diagram illustrating an example configuration of a system to which a circuit breaker characteristic monitoring device according to the present invention is applied.

FIG. 1 is a diagram illustrating an example configuration of a system to which a circuit breaker characteristic monitoring device according to the present invention is applied. A circuit breaker characteristic monitoring device 1 monitors the characteristics of a circuit breaker installed in a substation, a switching station, or the like, specifically, the characteristics of a circuit breaker that includes an operating device 2 and an arc-extinguishing chamber 3.

The circuit breaker characteristic monitoring device 1 includes an operating time measurement unit 11 and a contact consumption amount estimation unit 12, and it is configured such that an external device such as a personal computer (PC) can be connected thereto.

In the circuit breaker, the operating device 2 includes an opening electromagnet 21, a closing electromagnet 22, an output lever 23, and an operating speed measurement unit 24. The arc-extinguishing chamber 3 includes a movable contact 31 and fixed contacts 32. The output lever 23 is configured to be rotatable about a rotation axis not illustrated. The movable contact 31 is connected to the output lever 23. That is, the movable contact 31 is configured to travel with the rotation of the output lever 23. Thus, when an opening operation is performed to switch from a state where the movable contact 31 and the fixed contacts 32 are electrically connected to a state where they are not electrically connected, the output lever 23 is rotated in a first direction. In contrast, when a closing operation is performed to switch from a state where the movable contact 31 and the fixed contacts 32 are not electrically connected to a state where they are electrically connected, the output lever 23 is rotated in a second direction opposite to the first direction. When the operating device 2 satisfies a certain predetermined condition, it performs the opening operation or the closing operation. For example, when the operating device 2 detects that current passing through a load (not illustrated) connected via the fixed contacts 32 exceeds a certain value, it performs the opening operation. In the opening operation, current is passed through the opening electromagnet 21 to generate a magnetic field to rotate the output lever 23 in the first direction. In the closing operation, current is passed through the closing electromagnet 22 to generate a magnetic field to rotate the output lever 23 in the second direction. The operating speed measurement unit 24 measures the travel speed of the movable contact 31 in the opening operation and the closing operation. The travel speed is calculated on the basis of the position of the movable contact 31. The position can be measured by a method similar to conventional methods described in Patent Literatures 1 and 2 and others. For example, a barcode may be attached to a movable portion such as the output lever 23 or the movable contact 31 to be read optically, and thereby measurement is performed. The operating speed measurement unit 24 measures the position of the movable contact 31 more than once during the opening operation and the closing operation, and it calculates the travel speed on the basis of the times at which the measurements were performed and on the basis of the measurement results. The operating speed measurement unit 24 notifies the circuit breaker characteristic monitoring device 1 of the travel speed of the movable contact 31.

In the circuit breaker characteristic monitoring device 1, the operating time measurement unit 11 measures the opening time, which is the time required for the circuit breaker to enter an open state after starting the opening operation, and the closing time, which is the time required for the circuit breaker to enter a closed state after starting the closing operation. The opening time is the time required for the movable contact 31 and the fixed contacts 32 to separate after a control current instructing opening is passed. The closing time is the time required for the movable contact 31 and the fixed contacts 32 to make contact after a control current instructing closing is passed. The opening time can be measured on the basis of the control current passing through the opening electromagnet 21 and the load current. When the control current instructing opening passes through the opening electromagnet 21, the operating time measurement unit 11 determines that the opening operation is started and starts the measurement of the opening time. When the load current becomes zero, the operating time measurement unit 11 determines that the open state is reached and ends the measurement. The closing time can be measured on the basis of the control current passing through the closing electromagnet 22 and the load current. When the control current instructing closing passes through the closing electromagnet 22, the operating time measurement unit 11 determines that the closing operation is started and starts the measurement of the closing time. When the load current starts to pass, the operating time measurement unit 11 determines that the closed state is reached and ends the measurement.

In the opening operation and the closing operation, the distance traveled by the movable contact 31 is fixed. In the closing operation, the movable contact 31 continues to travel after making contact with the fixed contacts 32, and it stops when reaching a first specified position. Similarly, in the opening operation, the movable contact 31 continues to travel after separating from the fixed contacts 32, and it stops when reaching a second specified position. That is, the movable contact 31 travels from the second specified position to the first specified position in the closing operation, and it travels from the first specified position to the second specified position in the opening operation. However, there are some circuit breakers of a type in which during the closing operation, after traveling beyond the first specified position, the movable contact 31 returns in the opposite direction by a minute distance and then stops in the first specified position.

The contact consumption amount estimation unit 12 estimates the amount of the movable contact 31 and the fixed contacts 32 consumed, on the basis of the operating time, which is the opening time or the closing time measured by the operating time measurement unit 11, and the travel speed of the movable contact 31 during the opening operation or during the closing operation.

Figure 2:
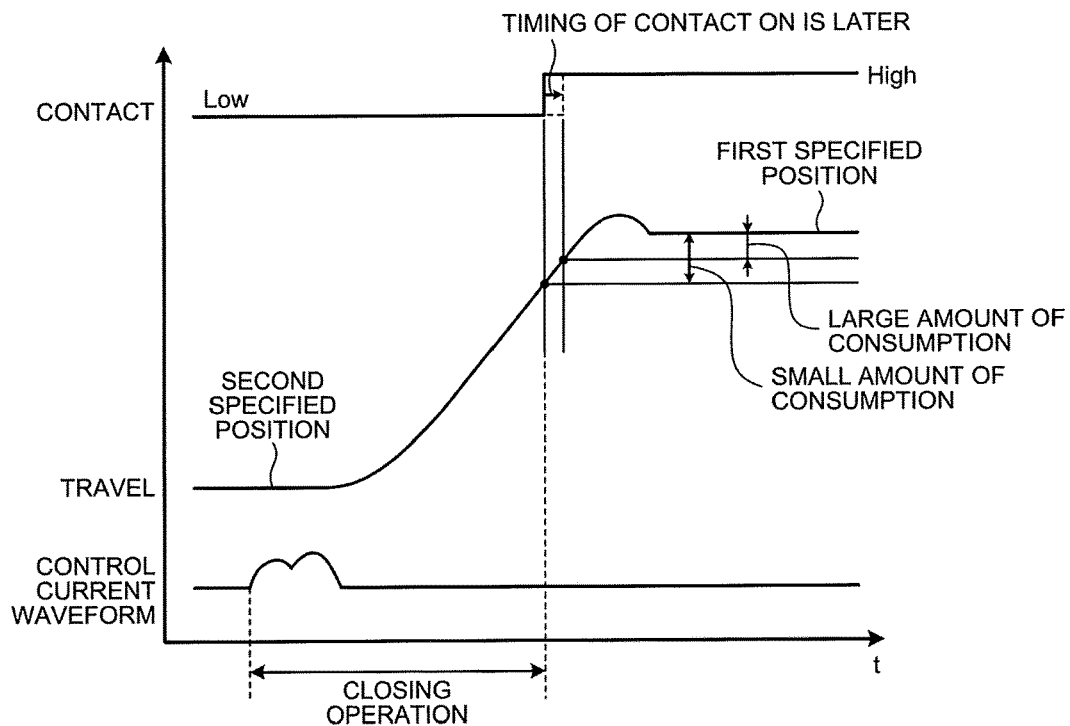
FIG. 2 is a diagram illustrating a method of estimating the amount of consumption of consumables on the basis of closing time.
Figure 3:
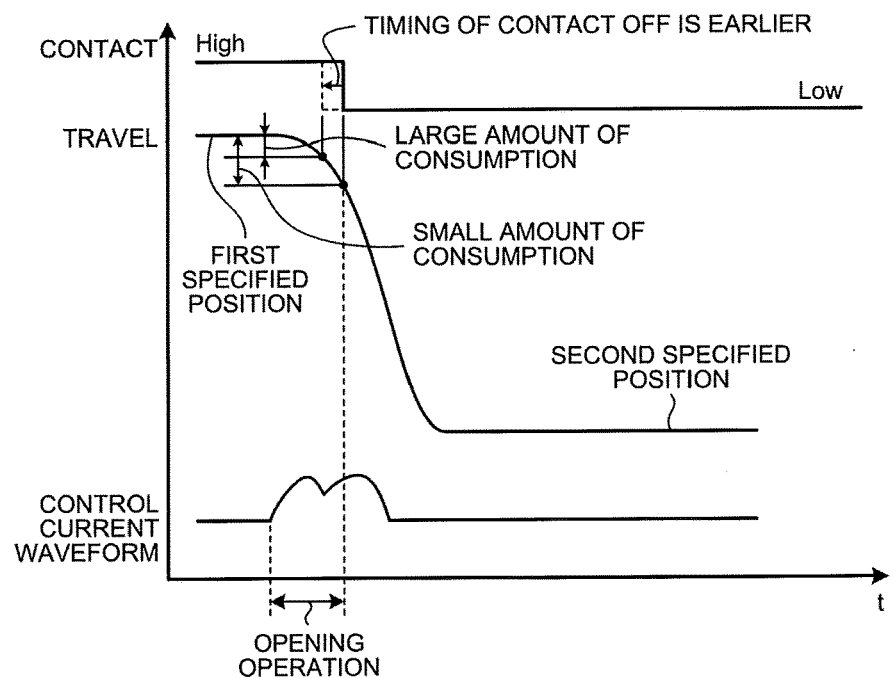
FIG. 3 is a diagram illustrating a method of estimating the amount of consumption of the consumables on the basis of opening time.

A method performed by the contact consumption amount estimation unit 12 of estimating the amount of the movable contact 31 and the fixed contacts 32 consumed will be described with reference to FIGS. 2 and 3. FIG. 2 is a diagram illustrating a method of estimating the amount of consumption on the basis of the closing time. FIG. 3 is a diagram illustrating a method of estimating the amount of consumption on the basis of the opening time. In FIGS. 2 and 3, "CONTACT" illustrated on the vertical axis represents the contact state of the movable contact 31 and the fixed contacts 32. Low indicates the open state, which is a state in which the movable contact 31 is not in contact with the fixed contacts 32, and High indicates the closed state, which is a state in which the movable contact 31 is in contact with the fixed contacts 32. In FIGS. 2 and 3, the timing at which the movable contact 31 makes contact with the fixed contacts 32 is expressed as CONTACT ON and the timing at which the movable contact 31 separates from the fixed contacts 32 is expressed as CONTACT OFF. "TRAVEL" represents the position of the movable contact 31 with reference to the second specified position, which is the position in which the movable contact 31 is farthest from the fixed contacts 32. As the movable contact 31 moves closer to the fixed contacts 32, the value of "TRAVEL" increases. That is, "TRAVEL" corresponds to the distance from the second specified position to the movable contact 31. "CONTROL CURRENT WAVEFORM" represents the waveform of a control current passing through the opening electromagnet 21 or the closing electromagnet 22. "CONTROL CURRENT WAVEFORM" in FIG. 2 represents the waveform of a control current passing through a coil constituting the closing electromagnet 22. "CONTROL CURRENT WAVEFORM" in FIG. 3 represents the waveform of a control current passing through a coil constituting the opening electromagnet 21. It is known that a control current increases at the start of a closing operation and at the start of an opening operation, as illustrated in the drawings.

In the closing operation, as illustrated in FIG. 2, the closing time increases as the amount of the movable contact 31 and the fixed contacts 32 consumed increases. Specifically, the timing at which the movable contact 31, after starting to travel toward the fixed contacts 32, makes contact with the fixed contacts 32 to turn the contact ON (closing timing) is delayed. In the opening operation, as illustrated in FIG. 3, the opening time decreases as the amount of the movable contact 31 and the fixed contacts 32 consumed increases. That is, the opening timing is earlier.

By taking these characteristics into consideration, the contact consumption amount estimation unit 12 estimates the amount of the movable contact 31 and the fixed contacts 32 consumed on the basis of the closing time or the opening time and the travel speed of the movable contact 31.

Specifically, when estimating the amount of consumption on the basis of the closing time and the travel speed of the movable contact 31, the contact consumption amount estimation unit 12 calculates the travel time of the movable contact 31 in the closing operation on the basis of the travel speed of the movable contact 31. Then, the travel time of the movable contact 31 in the closing operation is compared with the closing time. Here, the travel time of the movable contact 31 in the closing operation is the time required when the movable contact 31 travels between the position of the movable contact 31 at the start of the closing operation and the position of the movable contact 31 at the end of the closing operation. Hereinafter, this time is referred to as operating time. As described above, as the distance traveled by the movable contact 31 in the closing operation is fixed, the contact consumption amount estimation unit 12 can calculate the operating time on the basis of the travel speed measured by the operating speed measurement unit 24, i.e., the travel speed of the movable contact 31 in the closing operation. The distance traveled by the movable contact 31 in the closing operation is stored, for example, in a storage unit not illustrated. When the difference between the operating time of the movable contact 31 in the closing operation and the closing time, which is the travel time of the movable contact 31 until closing, is smaller than or equal to a predetermined threshold, it is determined that the amount of consumption is large and consumables need to be replaced, i.e., both of or one of the movable contact 31 and the fixed contacts 32 needs to be replaced. When it is determined that the consumables need to be replaced, notification that the movable contact 31 and the fixed contacts 32, which are consumables, need to be inspected and replaced is provided to an external device by using a display unit or a connected PC not illustrated, or another unit. Because the travel speed of the movable contact 31 in the closing operation is fixed unless a failure or the like occurs, information on the operating time of the movable contact 31 in the closing operation may be, for example, calculated beforehand and retained beforehand in a storage unit not illustrated.

When the closing time is measured by the operating time measurement unit 11, the contact consumption amount estimation unit 12 may compare it with the closing time measured by the operating time measurement unit 11 in the past, thereby estimating the amount of consumption. In this case, the difference between the closing time measured in the past and the newly measured closing time results in the estimation of the amount of consumption. It is assumed that the closing time measured in the past is the closing time measured during the first closing operation after the consumables are replaced.

When the amount of consumption is estimated on the basis of the opening time and the travel speed of the movable contact 31, the contact consumption amount estimation unit 12 calculates the travel time of the movable contact in the opening operation on the basis of the travel speed of the movable contact 31. Then, the travel time of the movable contact 31 in the opening operation is compared with the opening time. The travel time of the movable contact 31 in the opening operation equals "the travel time of the movable contact 31 in the closing operation" described above. When the difference between the operating time of the movable contact 31 in the opening operation and the opening time, which is the travel time of the movable contact 31 until opening, is larger than or equal to a predetermined threshold, it is determined that the amount of consumption is large and the consumables need to be replaced. Operating time information on the movable contact 31 in the opening operation may be, for example, calculated beforehand and retained beforehand in a storage unit not illustrated.

When the opening time is measured by the operating time measurement unit 11, the contact consumption amount estimation unit 12 may compare it with the opening time measured by the operating time measurement unit 11 in the past, thereby estimating the amount of consumption. In this case, the difference between the opening time measured in the past and the newly measured opening time results in the estimation of the amount of consumption. It is assumed that the opening time measured in the past is the opening time measured during the first opening operation after the consumables are replaced.

The estimation of the amount of consumption by the contact consumption amount estimation unit 12 may be performed during both of the closing operation and the opening operation, or it may be performed during one of the operations.

Thus, a circuit breaker characteristic monitoring device according to the present embodiment estimates the amount of consumption of the movable contact and fixed contacts, which are consumables consumed during the execution of a closing operation and an opening operation on the basis of closing time, which is the time between the start of the closing operation and closing, and/or opening time, which is the time between the start of the opening operation and opening, and the travel speed of the movable contact. When the amount of consumption reaches a specified value, notification that the consumables need to be replaced is provided to an external device. This allows the consumables to be replaced at an appropriate timing. Further, a reduction in operating costs involved in maintenance inspection and a reduction in component costs can be achieved.

REFERENCE SIGNS LIST 1 circuit breaker characteristic monitoring device, 2 operating device, 3 arc-extinguishing chamber, 11 operating time measurement unit, 12 contact consumption amount estimation unit, 21 opening electromagnet, 22 closing electromagnet, 23 output lever, 24 operating speed measurement unit, 31 movable contact, 32 fixed contact.

The invention claimed is:

1. A circuit breaker characteristic monitoring device that monitors an operation of a circuit breaker including a movable contact and a fixed contact to estimate an amount of consumption of the movable contact and the fixed contact included in the circuit breaker, the movable contact starting to travel from a first specified position, continuing to travel after separating from the fixed contact, and traveling to a second specified position different from the first specified position in an opening operation and the movable contact starting to travel from the second specified position, continuing to travel after making contact with the fixed contact, and traveling to the first specified position in a closing operation, the circuit breaker characteristic monitoring device comprising:
   an operating time measurement unit to measure at least one of closing time and opening time, the closing time being a time required for the circuit breaker to be closed after starting the closing operation, the opening time being a time required for the circuit breaker to be open after starting the opening operation; and
   a contact consumption amount estimation unit to, when the operating time measurement unit measures the closing time, calculate travel time of the movable contact, on a basis of a distance between the first specified position and the second specified position and travel speed of the movable contact in the closing operation, compare the calculated travel time with the closing time, and estimate that the amount of consumption exceeds a certain value when a difference between the travel time and the closing time is smaller than or equal to a first threshold, and to, when the operating time measurement unit measures the opening time, calculate travel time of the movable contact, on a basis of the distance and travel speed of the movable contact in the opening operation, compare the calculated travel time with the opening time, and estimate that the amount of consumption exceeds a certain value when a difference between the travel time and the opening time is larger than or equal to a second threshold.

2. The circuit breaker characteristic monitoring device according to claim 1, wherein the operating time measurement unit performs at least one of first processing and second processing, the first processing being processing in which the closing time is measured on a basis of a first control current passing through a closing electromagnet used in the closing operation and a load current that is a current passing through a load via the circuit breaker, the second processing being processing in which the opening time is measured on a basis of a second control current passing through an opening electromagnet used in the opening operation and the load current.

3. The circuit breaker characteristic monitoring device according to claim 1, wherein, when the estimated amount of consumption exceeds a certain value, the contact consumption amount estimation unit provides, to an external device, notification that the movable contact the fixed contact need to be replaced.

* * * * *